US011516917B2

(12) United States Patent
Park et al.

(10) Patent No.: US 11,516,917 B2
(45) Date of Patent: Nov. 29, 2022

(54) ELECTRONIC DEVICE USING INTERPOSER IN PRINTED CIRCUIT BOARD

(71) Applicant: Samsung Electronics Co., Ltd., Gyeonggi-do (KR)

(72) Inventors: Junghoon Park, Gyeonggi-do (KR); Younggirl Yun, Gyeonggi-do (KR); Sunggeun Kang, Gyeonggi-do (KR); Myungsub Ko, Gyeonggi-do (KR); Jaeyeon Ra, Gyeonggi-do (KR); Seungbo Shim, Gyeonggi-do (KR); Yongjin Woo, Gyeonggi-do (KR); Junhee Han, Gyeonggi-do (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/172,351

(22) Filed: Feb. 10, 2021

(65) Prior Publication Data

US 2021/0251079 A1 Aug. 12, 2021

(30) Foreign Application Priority Data

Feb. 10, 2020 (KR) .................. 10-2020-0015924

(51) Int. Cl.
*H05K 1/11* (2006.01)
*H05K 1/14* (2006.01)
*H05K 1/02* (2006.01)

(52) U.S. Cl.
CPC .......... *H05K 1/147* (2013.01); *H05K 1/0216* (2013.01); *H05K 2201/10037* (2013.01); *H05K 2201/10098* (2013.01); *H05K 2201/10128* (2013.01); *H05K 2201/10378* (2013.01); *H05K 2201/10515* (2013.01)

(58) Field of Classification Search
USPC ........................................................ 361/803
See application file for complete search history.

(56) References Cited

U.S. PATENT DOCUMENTS

| 8,893,378 | B2 | 11/2014 | Horng |
| 9,651,751 | B1 * | 5/2017 | Ding .................... G02B 6/4245 |
| 10,159,144 | B2 | 12/2018 | Kariyazaki et al. |
| 10,939,552 | B2 | 3/2021 | Park et al. |
| 11,096,269 | B2 | 8/2021 | So et al. |

(Continued)

FOREIGN PATENT DOCUMENTS

| CN | 107306511 | 10/2017 |
| KR | 100913171 | 8/2009 |

(Continued)

OTHER PUBLICATIONS

International Search Report dated May 10, 2021 issued in counterpart application No. PCT/KR2021/001275, 9 pages.

*Primary Examiner* — Andargie M Aychillhum
(74) *Attorney, Agent, or Firm* — The Farrell Law Firm, P.C.

(57) ABSTRACT

An electronic device includes a processor and a printed circuit board on which the processor is mounted. The printed circuit board includes a first circuit board, a first interposer formed on a first portion of the first circuit board, a second interposer formed on a second portion of the first circuit board that is adjacent to the first portion, a second circuit board coupled to the first interposer, and a third circuit board coupled to the second interposer.

18 Claims, 7 Drawing Sheets

(56) References Cited

U.S. PATENT DOCUMENTS

| | | | |
|---|---|---|---|
| 2008/0309844 A1* | 12/2008 | Seo | G02F 1/13452 |
| | | | 349/58 |
| 2012/0243195 A1* | 9/2012 | Lim | H05K 1/141 |
| | | | 361/784 |
| 2013/0201648 A1* | 8/2013 | Cheng | H05K 1/144 |
| | | | 361/803 |
| 2014/0048326 A1 | 2/2014 | Lin et al. | |
| 2017/0261708 A1 | 9/2017 | Ding et al. | |
| 2019/0067821 A1* | 2/2019 | Kim | H01Q 3/247 |
| 2019/0082535 A1 | 3/2019 | Myers et al. | |
| 2019/0082536 A1 | 3/2019 | Park et al. | |
| 2019/0089037 A1* | 3/2019 | Besel | H01P 5/04 |
| 2019/0341168 A1 | 11/2019 | Yonemori et al. | |
| 2020/0068730 A1* | 2/2020 | Kimata | H05K 5/0069 |
| 2020/0344869 A1 | 10/2020 | So et al. | |
| 2021/0014970 A1 | 1/2021 | Ha et al. | |
| 2021/0055499 A1* | 2/2021 | Yan | G03B 30/00 |

FOREIGN PATENT DOCUMENTS

| | | |
|---|---|---|
| KR | 1020140092018 | 7/2014 |
| KR | 101486366 | 1/2015 |
| KR | 1020190125461 | 11/2019 |

\* cited by examiner

ELECTRONIC DEVICE USING INTERPOSER IN PRINTED CIRCUIT BOARD

CROSS-REFERENCE TO RELATED APPLICATION(S)

This application is based on and claims priority under 35 U.S.C. § 119 to Korean Patent Application No. 10-2020-0015924, filed on Feb. 10, 2020, in the Korean Intellectual Property Office, the entire disclosure of which is incorporated herein by reference.

BACKGROUND

1. Field

The disclosure generally relates to an electronic device using an interposer in a printed circuit board.

2. Description of Related Art

Electronic devices such as smartphones are becoming smaller and multifunctional. To this end, electronic devices include a printed circuit board (PCB), a printed board assembly (PBA), or a flexible printed circuit board (FPCB), on which various electronic parts are mounted.

Electronic parts (e.g., a processor, a memory, a camera, a broadcasting receiving module, a communication module, etc.) that are required for the electronic device may be mounted on the printed circuit board. The printed circuit board may include circuit wiring that connects the electronic parts mounted on the printed circuit board.

An electronic device may include a plurality of printed circuit boards. An interposer may be disposed among the plurality of printed circuit boards. The interposer may include VIAs that electrically connect the plurality of printed circuit boards. The interposer may be disposed to surround various electronic parts (e.g., a processor, a memory, a camera, a broadcasting receiving module, or a communication module). In general, the interposer may be formed to have one interior space corresponding to the shapes of the plurality of printed circuit boards. However, in the case of the interposer having the one interior space, electro-magnetic interference may occur between the electronic parts disposed in the interior space of the interposer. Furthermore, when the interposer has a complicated shape so as to form the one interior space, stress applied to the interposer by warpage of the plurality of printed circuit boards may be increased.

SUMMARY

Aspects of the disclosure are to address at least the above-mentioned problems and/or disadvantages and to provide at least the advantages described below. Accordingly, an aspect of the disclosure is to provide an electronic device for preventing poor contact of slave printed circuit boards coupled to a plurality of interposers, by using the interposers on a main printed circuit board.

Another aspect of the disclosure is to provide an electronic device for efficiently blocking electro-magnetic interference (EMI) noise interference between integrated circuit blocks using a plurality of interposers.

In accordance with an aspect of the disclosure, an electronic device includes a processor and a printed circuit board on which the processor is mounted. The printed circuit board includes a first circuit board, a first interposer formed on a first portion of the first circuit board, a second interposer formed on a second portion of the first circuit board that is adjacent to the first portion, a second circuit board coupled to the first interposer, and a third circuit board coupled to the second interposer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
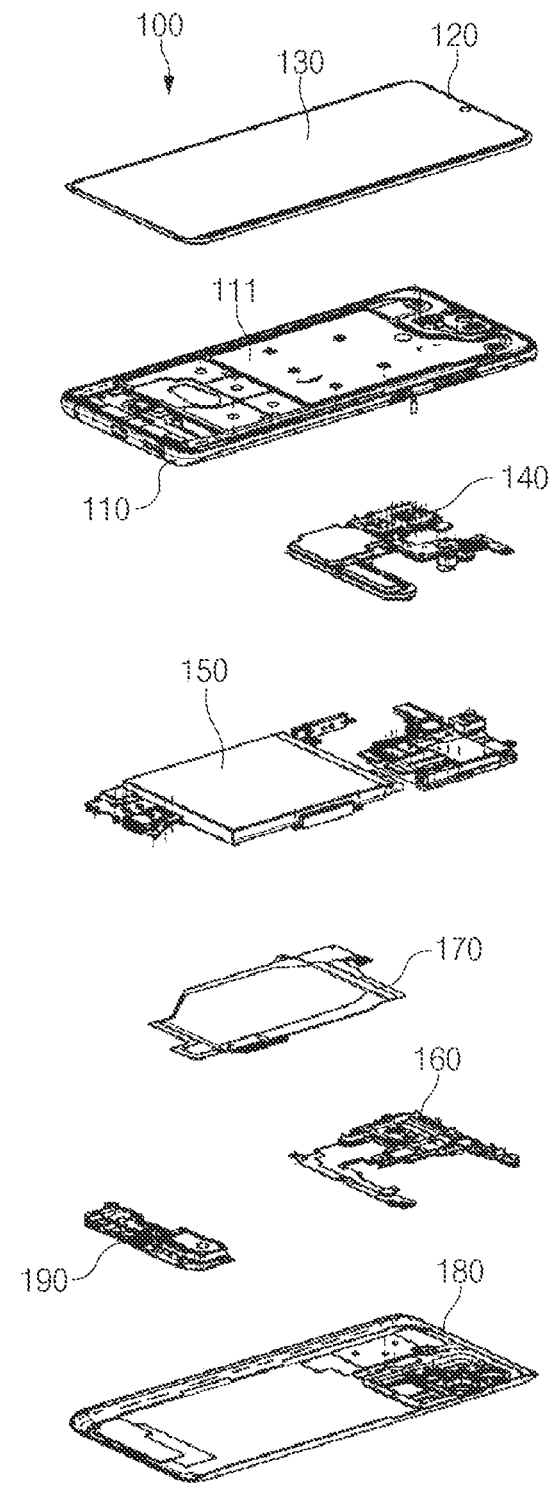
FIG. 1 is an exploded perspective view of an electronic device, according to an embodiment.

Hereinafter, various embodiments of the disclosure may be described with reference to accompanying drawings. In the following description made with respect to the accompanying drawings, similar components will be assigned similar reference numerals.

Accordingly, those of ordinary skill in the art will recognize that modifications, and/or equivalent or alternative descriptions of the various embodiments described herein can be variously made without departing from the scope and spirit of the disclosure.

FIG. 1 is an exploded perspective view of an electronic device, according to an embodiment.

Referring to FIG. 1, the electronic device 100 may include a side bezel structure 110, a first support member 111 (e.g., a bracket), a front plate 120, a display 130, a printed circuit board 140, a battery 150, a second support member 160, an antenna 170, a back plate 180, and a sub-printed circuit board 190. In some embodiments, the electronic device 100 may omit at least one component (e.g., the first support member 111 or the second support member 160) among the components, or may additionally include other component(s).

The front plate 120 may be formed such that at least part thereof is substantially transparent. For example, the front plate 120 may include a glass plate including various coating layers, or a polymer plate. The back plate 180 may be formed to be substantially opaque. For example, the back plate 180 may be formed of coated or colored glass, ceramic, a polymer, metal (e.g., aluminum, stainless steel (STS), or magnesium), or a combination of at least two thereof. The side bezel structure 110 may be formed of metal and/or a polymer. In some embodiments, the back plate 180 and the side bezel structure 110 may be integrally formed with each other and may contain the same material (e.g., a metallic material such as aluminum).

The first support member 111 may be disposed inside the electronic device 100 and may be connected with the side bezel structure 110, or may be integrally formed with the side bezel structure 110. The first support member 111 may be formed of, for example, a metallic material and/or a nonmetallic (e.g., polymer) material. The display 130 may be coupled to one surface of the first support member 111, and the printed circuit board 140 may be coupled to an opposite surface of the first support member 111. The printed circuit hoard 140 may have a processor, a memory, and/or various electronic parts mounted thereon.

The processor may include, for example, one or more of a central processing unit (CPU), an application processor (AP), a graphic processing unit (GPU), an image signal processor (ISP), a sensor hub processor, or a communication processor (CP).

The memory may include, for example, a volatile memory or a nonvolatile memory.

The various electronic parts may include, for example, one or more of a power management integrated circuit (PMIC), a camera power integrated circuit (IC), a communication power IC, a motor driver IC, and/or a speaker amplification IC.

The display 130, for example, may be exposed through most of the front plate 120. In some embodiments, the periphery of the display 130 may be formed to be substantially the same as the shape of the adjacent periphery of the front plate 120. In other embodiments, to expand the area by which the display 130 is exposed, the gap between the periphery of the display 130 and the periphery of the front plate 120 may be formed to be substantially constant.

In another embodiment, recesses or openings may be formed in part of a screen display area of the display 130, and the electronic device 100 may include at least one of an audio module, a sensor module, a camera module, and a light emitting element that are aligned with the recesses or the openings. The electronic device 100 may further include, for example on a rear surface of the screen display area of the display 130, at least one of an audio module, a sensor module, a camera module, a fingerprint sensor, and a light emitting element. The display 130 may also be combined with, or disposed adjacent to, touch detection circuitry, a pressure sensor for measuring the intensity (pressure) of a touch, and/or a digitizer for detecting a stylus pen of a magnetic field type.

The battery 150 may supply electric power to at least one component of the electronic device 100 and may include, for example, a secondary battery that is rechargeable. At least part of the battery 150, for example, may be disposed on substantially the same plane as the printed circuit board 140. The battery 150 may be integrally disposed inside the electronic device 100, or may be disposed so as to be detachable from the electronic device 100.

The antenna 170 may be disposed between the back plate 180 and the battery 150. The antenna 170 may include, for example, a near field communication (NFC) antenna, a wireless charging antenna, and/or a magnetic secure transmission (MST) antenna. The antenna 170, for example, may perform short-range communication with an external device, or may wirelessly transmit and receive electric power required for charging. In another embodiment, an antenna structure may be formed by part of the side bezel structure 110 and/or part of the first support member 111, or a combination thereof.

The sub-printed circuit board 190 may be disposed in part of the electronic device 100 (e.g., a lower end portion of the electronic device 100). For example, the sub-printed circuit board 190 may be connected with the printed circuit board 140 through various FPCBs. The sub-printed circuit board 190 may have various interfaces mounted thereon. The interfaces may include, for example, a high definition multimedia interface (HDMI), a universal serial bus (USB) interface, an SD card interface, and/or an audio interface. The interfaces, for example, may electrically or physically connect the electronic device 100 with external electronic devices and may include a USB connector, an SD card/MMIC connector, or an audio connector.

Figure 2A:
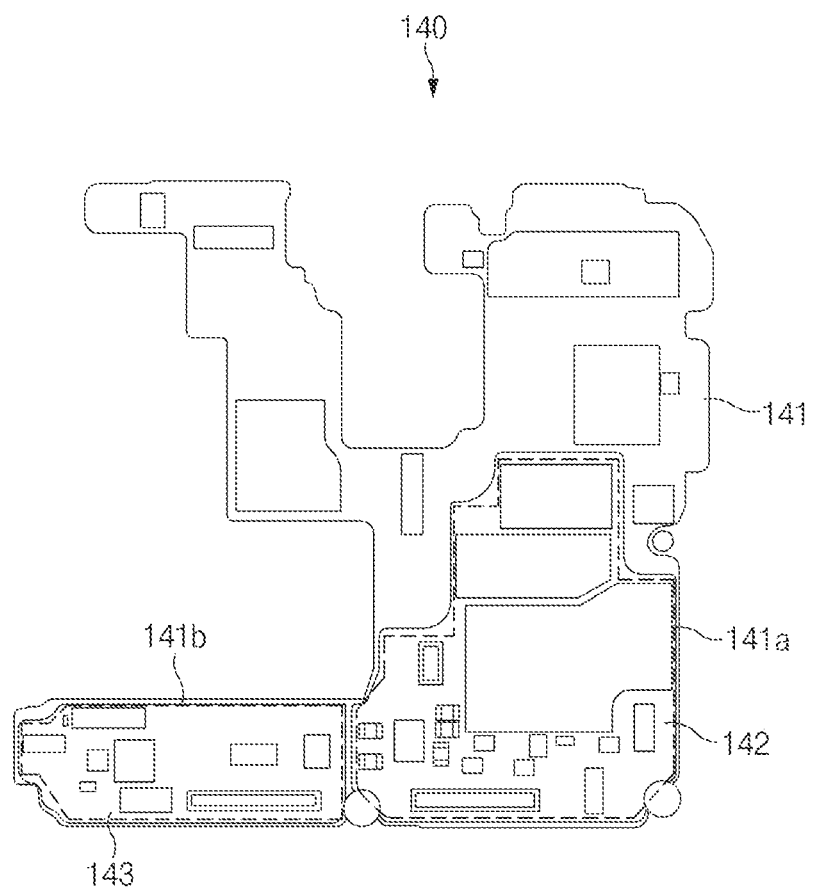
FIG. 2A is a view illustrating a printed circuit board of FIG. 1.
Figure 2B:
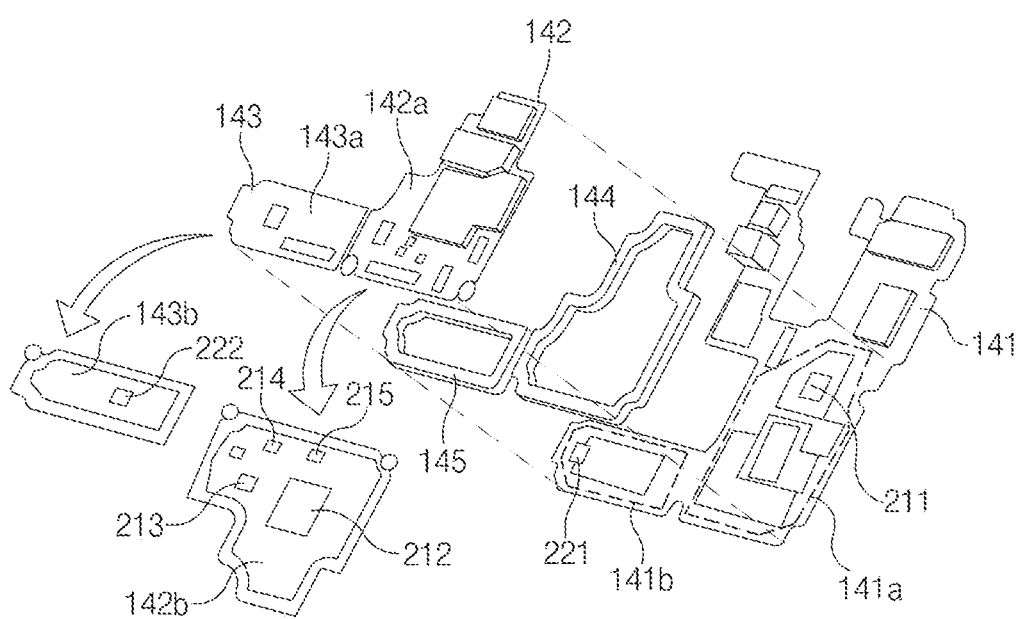
FIG. 2B is an exploded perspective view of the printed circuit board of FIG. 2A.

FIG. 2A is a view illustrating the printed circuit board of FIG. 1. FIG. 2B is an exploded perspective view of the printed circuit board of FIG. 2A.

Referring to FIGS. 2A and 2B, the printed circuit board 140 may include a first circuit hoard 141 (e.g., a main circuit board), a second circuit board 142 (e.g., a first slave circuit board), a third circuit board 143 (e.g., a second slave circuit board), a first interposer 144, and a second interposer 145.

The first interposer 144 and the second interposer 145 may be disposed on at least part of the first circuit board 141. For example, the second circuit board 142 may be disposed on the first interposer 144. The third circuit board 143 may be disposed on the second interposer 145. The first interposer 144 and the second interposer 145 may be spaced apart from each other at a specified interval (e.g., an interval smaller than the widths of the interposers). The first interposer 144 may include wiring that connects the first circuit board 141 and the second circuit board 142. The second interposer 145 may include wiring that connects the first circuit board 141 and the third circuit board 143. In another embodiment, a third interposer adjacent to the first interposer 144 or the second interposer 145 may be disposed on the first circuit board 141.

The second circuit board 142 may include a first surface 142a and a second surface 142b that faces the first circuit board 141. The third circuit board 143 may include a third surface 143a and a fourth surface 143b that faces the first circuit board 141.

The first interposer 144 and the second interposer 145 may have the same thickness or may have different thicknesses. For example, the thickness of the first interposer 144 may be determined based on the height of a part mounted on a first portion 141a of the first circuit board 141 or the second surface 142b of the second circuit board 142. The thickness of the second interposer 145 may be determined based on the height of a part mounted on a second portion 141b of the first circuit board 141 or the fourth surface 143b of the third circuit board 143.

The first interposer 144 and the second circuit board 142 may be disposed on the first portion 141a of the first circuit board 141. The second interposer 145 and the third circuit board 143 may be disposed on the second portion 141b of the first circuit board 141 that protrudes from part of the first portion 141a, For example, the first portion 141a and the second portion 141b may be formed in an "L-shape". In another example, the first portion 141a and the second portion 141b may be formed in a "T-shape" or a "C-shape".

A plurality of interposers (e.g., the first interposer 144 and the second interposer 145) may be disposed on a main circuit board (e.g., the first circuit board 141), and a plurality of corresponding slave circuit boards (e.g., the second circuit board 142 and the third circuit board 143) may be coupled to the plurality of interposers. Accordingly, pressures applied to the plurality of slave circuit boards may be reduced. For example, in a process (e.g., a surface mount device (SMD) process) of coupling the first circuit board 141, the first interposer 144, and the second circuit board 142, heat at a specific temperature may be applied, and at this time, the first circuit board 141 and the second circuit board 142 may have different degrees of expansion. Furthermore, in a process of coupling the first circuit board 141, the second interposer 145, and the third circuit board 143, heat at a specific temperature may be applied, and at this time, the first circuit board 141 and the third circuit board 143 may have different degrees of expansion. If the first interposer 144 and the second interposer 145 are formed in a shape having one closed curve and the second circuit board 142 and the third circuit board 143 are formed as one circuit board, part of the one circuit board including the second circuit board 142 and the third circuit board 143 may warp in a process of coupling the one circuit board with the first circuit board 141, and therefore may result in poor contact. When the shape of the one circuit board including the second circuit board 142 and the third circuit board 143 includes a bent portion (e.g., an L-shaped portion), the circuit board may be badly warped as a result of the coupling process. Accordingly, in the case of mounting the plurality of interposers (e.g., the first interposer 144 and the second interposer 145) on the one main circuit board and coupling the plurality of slave circuit boards to the plurality of interposers, deformation of the slave circuit boards may be minimized.

The plurality of interposers 144 and 145 disposed on the main circuit board 141 may perform an electrical shielding function. For example, an element generating electro-magnetic interference (EMI) noise and an element affected by the EMI noise may be disposed in different interposers. For example, elements (e.g., a PMIC 211, a communication IC 212, a short-range communication IC 213, a speaker amplifier IC 214, or a motor drive IC 215) that generate EMI noise may be disposed in an interior space formed by the first circuit board 141, the first interposer 144, and the second circuit board 142. The PMIC 211 may be disposed on one surface of the first circuit board 141 on which the first interposer 144 is disposed. The communication IC 212 or the short-range communication IC 213 may be disposed on one surface of the second circuit board 142 that faces the first circuit board 141. In another example, elements (e.g., a camera power IC 221 or a display power IC 222) affected by the EMI noise may be disposed in an interior space formed by the first circuit board 141, the second interposer 145, and the third circuit board 143. The camera power IC 221 may be disposed on the one surface of the first circuit board 141 on which the second interposer 145 is disposed. The display power IC 222 may be disposed on one surface of the third circuit board 143 that faces the first circuit board 141.

Figure 3:
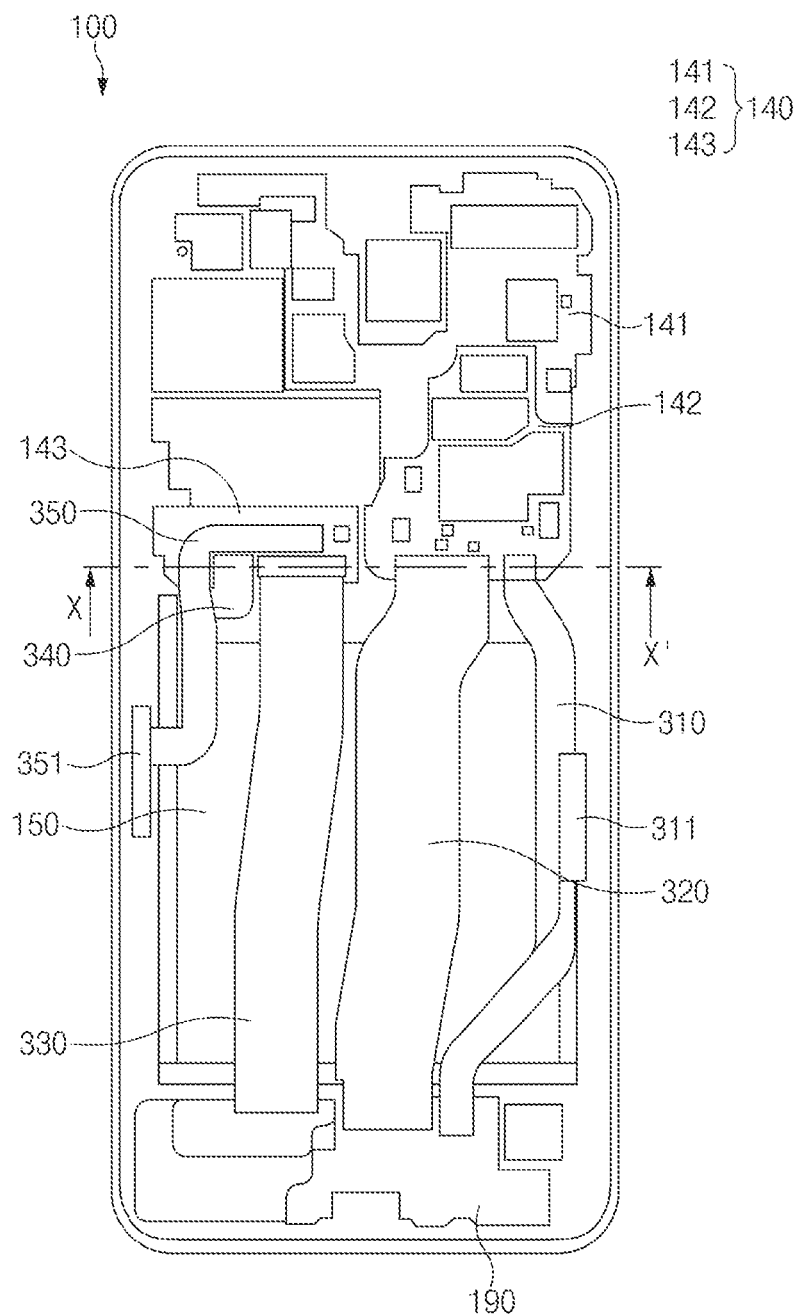
FIG. 3 is a view illustrating a connection relationship of the printed circuit board and a sub-printed circuit board disposed in the electronic device, according to an embodiment.
Figure 4:
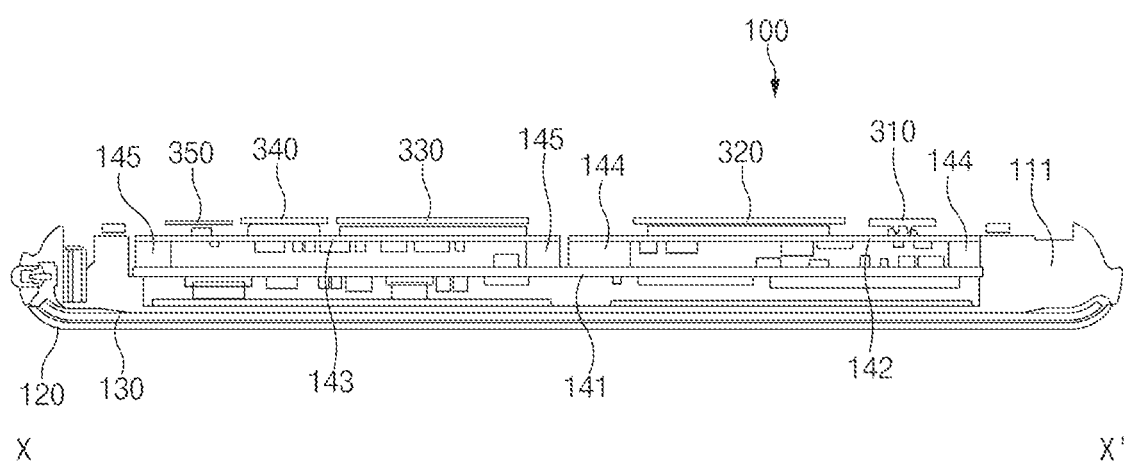
FIG. 4 is a sectional view taken along line X-X' of FIG. 3.

FIG. 3 is a view illustrating a connection relationship of the printed circuit board and the sub-printed circuit board disposed in the electronic device, according to an embodiment. FIG. 4 is a sectional view taken along line X-X' of FIG. 3.

Referring to FIGS. 3 and 4, the printed circuit board 140 may be connected to the sub-printed circuit board 190 through a plurality of FPCBs. For example, a first FPCB 310 or a second FPCB 320 may connect the second circuit board 142 and the sub-printed circuit board 190. A third FPCB 330 may connect the third circuit board 143 and the sub-printed circuit board 190. A fourth FPCB 340 may connect the third circuit board 143 and the battery 150. A fifth FPCB 350 may connect the third circuit board 143 and a first 5G antenna module 351. For example, the first FPCB 310, the second FPCB 320, or the third FPCB 330 may be disposed to extend parallel to one surface of the battery 150. In another example, the first FPCB 310 may connect the second circuit board 142 and a second 5G antenna module 311, In another example, the second 5G antenna module 311 may be connected with the second circuit board 142 through an additional FPCB.

With reference to FIG. 2B, the second circuit board 142 may include, on one surface thereof (e.g., the first surface 142a of the second circuit board 142), a first connector or a second connector that is connected with a communication IC (e.g., the communication IC 212 or the short-range communication IC 213). The first connector may be connected with the first FPCB 310. The second connector may be connected with the second FPCB 320. The third circuit board 143 may include, on one surface thereof (e.g., the third surface 143a of the third circuit board 143), a third connector connected with a display power IC (e.g., the display power IC 222), a fourth connector connected with a PMIC (e.g., the PMIC 211), or a fifth connector connected with a communication IC (e.g., the communication IC 212 or the short-range communication IC 213). The third connector may be connected with the third FPCB 330. The fourth connector may be connected with the fourth FPCB 340. The fifth connector may be connected with the fifth FPCB 350.

The first FPCB 310 or the second FPCB 320 may connect the communication IC 212 or 213 mounted on the second circuit board 142 and the sub-printed circuit board 190. The third FPCB 330 may connect the display power IC 222 mounted on the third circuit board 143 and the sub-printed circuit board 190.

The first circuit board 141, the first interposer 144, and the second circuit board 142 may form one first shielding space. The first circuit hoard 141, the second interposer 145, and the third circuit board 143 may form one second shielding space.

According to an embodiment, an electronic device may include a processor and a printed circuit board on which the processor is mounted. The printed circuit board may include a first circuit board, a first interposer formed on a first portion of the first circuit board, a second interposer formed on a second portion of the first circuit board that is adjacent to the first portion, a second circuit board coupled to the first interposer, and a third circuit board coupled to the second interposer.

The printed circuit board may have a shape in which the second portion protrudes from part of a side surface of the first portion.

The second circuit board and the third circuit board may be disposed in an shape over the first circuit board.

The first portion, the first interposer, and the second circuit hoard may form one shielding space.

The second portion, the second interposer, and the third circuit board may form one shielding space.

The electronic device may further include a PMIC, and the PMIC may be mounted on the first portion.

The electronic device may further include a communication IC, and the communication IC may be mounted on one surface of the second circuit board.

The communication IC may be mounted on a first surface of the second circuit board that faces the first circuit board, and a connector connected with the communication IC may be mounted on a second surface of the second circuit board that is opposite to the first surface.

The electronic device may further include a sub-printed circuit board, and the communication IC may be connected to the sub-printed circuit board through an FPCB that is connected to the connector.

The electronic device may further include a camera power IC, and the camera power IC may be mounted on the second portion.

The electronic device may further include a display device and a display power IC that supplies electric power to the display device. The display power IC may be mounted on one surface of the third circuit board.

The display power IC may be mounted on a first surface of the third circuit board that faces the first circuit board, and a connector connected to the display power IC may be mounted on a second surface of the third circuit board that is opposite to the first surface.

The electronic device may further include a sub-printed circuit board, and the display power IC may be connected to the sub-printed circuit board through an FPCB that is connected to the connector.

The electronic device may further include a battery, and the battery may be connected with the third circuit board through an FPCB.

The electronic device may further include an antenna module, and the antenna module may be connected with the second circuit board through an FPCB.

Figure 5:
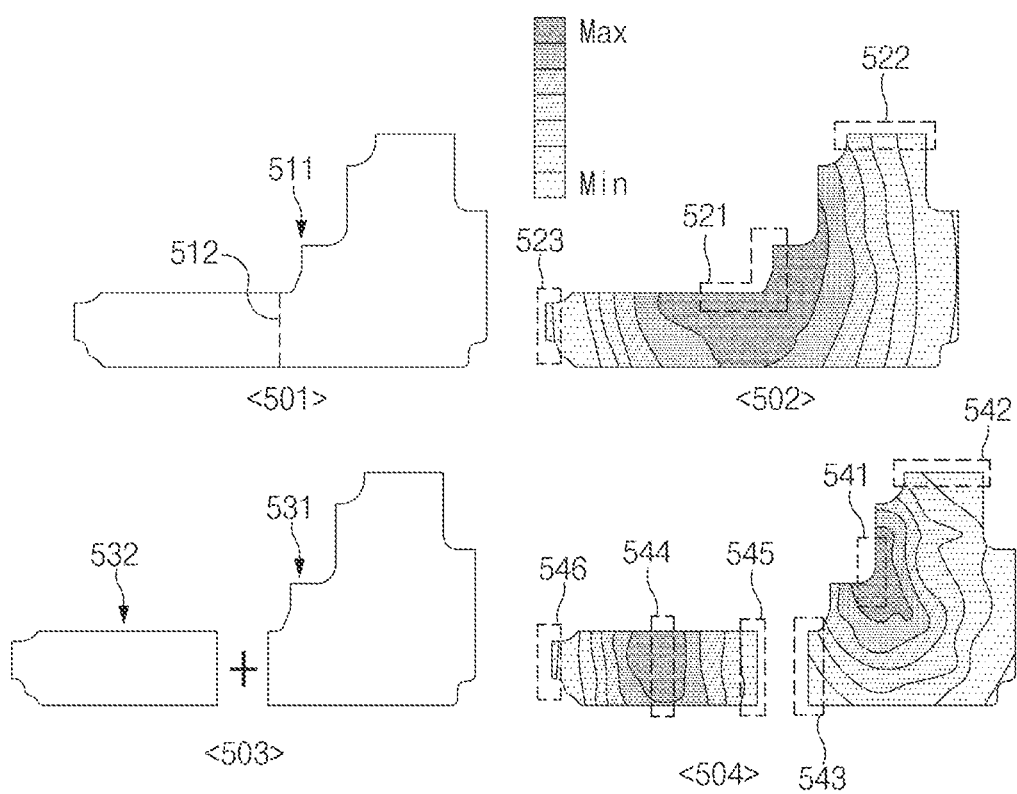
FIG. 5 is a view illustrating distributions of pressures applied to slave printed circuit boards, according to an embodiment.

FIG. 5 is a view illustrating distributions of pressures applied to slave printed circuit boards, according to an embodiment.

Referring to FIG. 5, it is assumed that a circuit board 511 in <501> and <502> is a slave printed circuit board obtained by combining the second circuit board 142 and the third circuit board 143 of FIG. 2A. The circuit board 511 may be coupled to a main printed circuit board (e.g., the first circuit board 141 of FIG. 2A) through an interposer corresponding to the shape of the circuit board 511. It is assumed that circuit boards 531 and 532 in <503> and <504> are two slave printed circuit boards that correspond to the second circuit board 142 and the third circuit board 143 of FIG. 2A. The circuit boards 531 and 532 may be coupled to the main printed circuit board through interposers corresponding to the shapes of the circuit boards 531 and 532. For example, <502> and <504> represent the intensities of pressures applied to the circuit boards 511, 531, and 532 in an SMD process. In <502> and <504>, the stepwise shading between maximum pressure Max and minimum pressure Min may represent relative pressure. Accordingly, as the distance between a point of maximum pressure Max and a point of minimum pressure Min is increased, the magnitude of a force acting between the point of maximum pressure Max and the point of minimum pressure Min may be increased.

In <501> and <502>, the pressure applied to a first portion 521 of the circuit board 511 may be highest, and the pressure applied to a second portion 522 and a third portion 523 of the circuit board 511 may be lowest. In <503> and <504>, the pressure applied to a fourth portion 541 of the circuit board 531 may be highest, and the pressure applied to a fifth portion 542 and a sixth portion 543 of the circuit board 531 may be lowest. The pressure applied to a seventh portion 544 of the circuit board 532 may be highest, and the pressure applied to an eighth portion 545 and a ninth portion 546 of the circuit board 532 may be lowest.

The distance between a point of maximum pressure the fourth portion 541) and a point of minimum pressure (e.g., the fifth portion 542 or the sixth portion 543) of the circuit board 531 may be shorter than the distance between a point of maximum pressure (e.g., the first portion 521) and a point of minimum pressure (e.g., the second portion 522 or the third portion 523) of the circuit board 511. Furthermore, the distance between a point of maximum pressure (e.g., the seventh portion 544) and a point of minimum pressure (e.g., the eighth portion 545 or the ninth portion 546) of the circuit board 532 may be shorter than the distance between a point of maximum pressure (e.g., the first portion 521) and a point of minimum pressure (e.g., the second portion 522 or the third portion 523) of the circuit board 511. Accordingly, the circuit board 511 may be more warped than the circuit board 531 or the circuit board 532. When the circuit board 511 is divided into the circuit board 531 and the circuit board 532, the bending strength of the circuit board in an SMD process may be weakened, and poor contact between interposers and slave printed circuit boards (e.g., the circuit board 531 and the circuit board 532) may be prevented. Furthermore, when the circuit board 511 is divided into the circuit board 531 and the circuit board 532, the flexibility of the main printed circuit board may be improved.

The pressure difference between the first portion 521 and the second portion 522 or between the first portion 521 and the third portion 523 of the circuit board 511 may be greater than the pressure difference between the fourth portion 541 and the fifth portion 542 or between the fourth portion 541 and the sixth portion 543 of the circuit board 531, or the pressure difference between the seventh portion 544 and the eighth portion 545 or between the seventh portion 544 and the ninth portion 546 of the circuit board 532. Accordingly, the circuit board 511 may be more warped than the circuit board 531 or the circuit board 532.

A sidewall 512 may exist in a bent portion of an interposer coupled with the circuit board 511. When the sidewall 512 exists inside the interposer, the flexibility of the main printed circuit board may be decreased, and therefore separation between the circuit board 511 and the interposer may occur.

Figure 6:
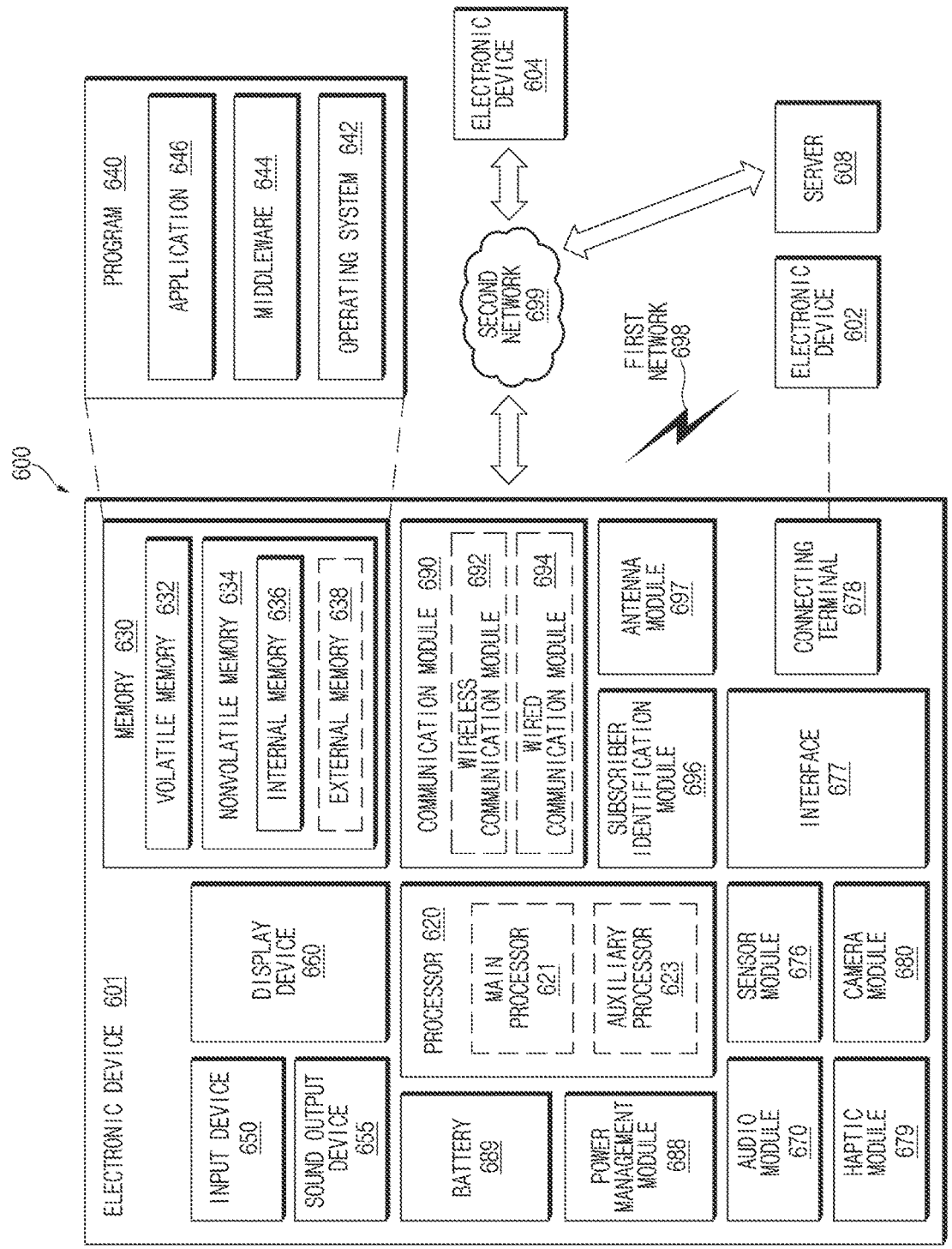
FIG. 6 is a block diagram illustrating an electronic device in a network environment, according to various embodiments.

FIG. 6 is a block diagram illustrating an electronic device 601 in a network environment 600 according to various embodiments. Referring to FIG. 6, the electronic device 601 in the network environment 600 may communicate with an electronic device 602 via a first network 698 (e.g., a short-range wireless communication network), or an electronic device 604 or a server 608 via a second network 699 (e.g., a long-range wireless communication network). According to an embodiment, the electronic device 601 may communicate with the electronic device 604 via the server 608. According to an embodiment, the electronic device 601 may include a processor 620, memory 630, an input device 650, a sound output device 655, a display device 660, an audio module 670, a sensor module 676, an interface 677, a haptic module 679, a camera module 680, a power management module 688, a battery 689, a communication module 690, a subscriber identification module (SIM) 696, or an antenna module 697. In some embodiments, at least one (e.g., the display device 660 or the camera module 680) of the components may be omitted from the electronic device 601, or one or more other components may be added in the electronic device 601. In some embodiments, some of the components may be implemented as single integrated circuitry. For example, the sensor module 676 (e.g., a fingerprint sensor, an iris sensor, or an illuminance sensor) may be implemented as embedded in the display device 660 (e.g., a display).

The processor 620 may execute, for example, software (e.g., a program 640) to control at least one other component (e.g., a hardware or software component) of the electronic device 601 coupled with the processor 620, and may perform various data processing or computation. According to one embodiment, as at least part of the data processing or computation, the processor 620 may load a command or data received from another component (e.g., the sensor module 676 or the communication module 690) in volatile memory 632, process the command or the data stored in the volatile memory 632, and store resulting data in non-volatile memory 634. According to an embodiment, the processor 620 may include a main processor 621 (e.g., a central processing unit (CPU) or an application processor (AP)), and an auxiliary processor 623 (e.g., a graphics processing unit (GPU), an image signal processor (ISP), a sensor hub processor, or a communication processor (CP)) that is operable independently from, or in conjunction with, the main processor 621. Additionally or alternatively, the auxiliary processor 623 may be adapted to consume less power than the main processor 621, or to be specific to a specified function. The auxiliary processor 623 may be implemented as separate from, or as part of the main processor 621.

The auxiliary processor 623 may control at least some of functions or states related to at least one component e.g., the display device 660, the sensor module 676, or the communication module 690) among the components of the electronic device 601, instead of the main processor 621 while the main processor 621 is in an inactive (e.g., sleep) state, or together with the main processor 621 while the main processor 621 is in an active state (e.g., executing an application). According to an embodiment, the auxiliary processor 623 (e.g., an image signal processor or a communication processor) may be implemented as part of another component e.g., the camera module 680 or the communication module 690) functionally related to the auxiliary processor 623.

The memory 630 may store various data used by at least one component (e.g., the processor 620 or the sensor module 676) of the electronic device 601. The various data may include, for example, software (e.g., the program 640) and input data or output data for a command related thereto. The memory 630 may include the volatile memory 632 or the non-volatile memory (334.

The program 640 may be stored in the memory 630 as software, and may include, for example, an operating system (OS) 642, middleware 644, or an application 646.

The input device 650 may receive a command or data to be used by other component (e.g., the processor 620) of the electronic device 601, from the outside (e.g., a user) of the electronic device 601. The input device 650 may include, for example, a microphone, a mouse, a keyboard, or a digital pen (e.g., a stylus pen).

The sound output device 655 may output sound signals to the outside of the electronic device 601. The sound output device 655 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 660 may visually provide information to the outside (e.g., a user) of the electronic device 601. The display device 660 may include, for example, a display, a hologram device, or a projector and control circuitry to control a corresponding one of the display, hologram device, and projector. According to an embodiment, the display device 660 may include touch circuitry adapted to detect a touch, or sensor circuitry (e.g., a pressure sensor) adapted to measure the intensity of force incurred by the touch.

The audio module 670 may convert a sound into an electrical signal and vice versa. According to an embodiment, the audio module 670 may obtain the sound via the input device 650, or output the sound via the sound output device 655 or a headphone of an external electronic device (e.g., an electronic device 602) directly (e.g., wiredly) or wirelessly coupled with the electronic device 601.

The sensor module 676 may detect an operational state (e.g., power or temperature) of the electronic device 601 or an environmental state (e.g., a state of a user) external to the electronic device 601, and then generate an electrical signal or data value corresponding to the detected state. According to an embodiment, the sensor module 676 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 677 may support one or more specified protocols to be used for the electronic device 601 to be coupled with the external electronic device (e.g., the electronic device 602) directly (e.g., wiredly) or wirelessly. According to an embodiment, the interface 677 may include, for example, a high definition multimedia interface (HDMI), a universal serial bus (USB) interface, a secure digital (SD) card interface, or an audio interface.

A connecting terminal 678 may include a connector via which the electronic device 601 may be physically connected with the external electronic device (e.g., the electronic device 602). According to an embodiment, the connecting terminal 678 may include, for example, a HDMI connector, a USB connector, a SD card connector, or an audio connector (e.g., a headphone connector).

The haptic module 679 may convert an electrical signal into a mechanical stimulus (e.g., a vibration or a movement) or electrical stimulus which may be recognized by a user via his tactile sensation or kinesthetic sensation. According to an embodiment, the haptic module 679 may include, for example, a motor, a piezoelectric element, or an electric stimulator.

The camera module 680 may capture a still image or moving images. According to an embodiment, the camera module 680 may include one or more lenses, image sensors, image signal processors, or flashes.

The power management module 688 may manage power supplied to the electronic device 601. According to one embodiment, the power management module 688 may be implemented as at least part of, for example, a power management integrated circuit (PMIC).

The battery 689 may supply power to at least one component of the electronic device 601. According to an embodiment, the battery 689 may include, for example, a primary cell which is not rechargeable, a secondary cell which is rechargeable, or a fuel cell.

The communication module 690 may support establishing a direct (e.g., wired) communication channel or a wireless communication channel between the electronic device 601 and the external electronic device (e.g., the electronic device 602, the electronic device 604, or the server 608) and performing communication via the established communication channel. The communication module 690 may include one or more communication processors that are operable independently from the processor 620 (e.g., the AP) and supports a direct (e.g., wired) communication or a wireless communication. According to an embodiment, the communication module 690 may include a wireless communication module 692 (e.g., a cellular communication module, a short-range wireless communication module, or a global navigation satellite system (GNSS) communication module)

or a wired communication module 694 (e.g., a local area network (LAN) communication module or a power line communication (PLC) module). A corresponding one of these communication modules may communicate with the external electronic device via the first network 698 (e.g., a short-range communication network, such as Bluetooth™, wireless-fidelity (Wi-Fi) direct, or infrared data association (IrDA)) or the second network 699 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 692 may identify and authenticate the electronic device 601 in a communication network, such as the first network 698 or the second network 699, using subscriber information (e.g., international mobile subscriber identity (IMSI)) stored in the subscriber identification module 696.

The antenna module 697 may transmit or receive a signal or power to or from the outside (e.g., the external electronic device) of the electronic device 601. According to an embodiment, the antenna module 697 may include an antenna including a radiating element composed of a conductive material or a conductive pattern formed in or on a substrate (e.g., PCB). According to an embodiment, the antenna module 697 may include a plurality of antennas. In such a case, at least one antenna appropriate for a communication scheme used in the communication network, such as the first network 698 or the second network 699, may be selected, for example, by the communication module 690 (e.g., the wireless communication module 692) from the plurality of antennas. The signal or the power may then be transmitted or received between the communication module 690 and the external electronic device via the selected at least one antenna. According to an embodiment, another component (e.g., a radio frequency integrated circuit (RFIC)) other than the radiating element may be additionally formed as part of the antenna module 697.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 601 and the external electronic device 604 via the server 608 coupled with the second network 699. Each of the electronic devices 602 and 604 may be a device of a same type as, or a different type, from the electronic device 601. According to an embodiment, all or some of operations to be executed at the electronic device 601 may be executed at one or more of the external electronic devices 602, 604, or 608. For example, if the electronic device 601 should perform a function or a service automatically, or in response to a request from a user or another device, the electronic device 601, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 601. The electronic device 601 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 640) including one or more instructions that are stored in a storage medium (e.g., internal memory 636 or external memory 638) that is readable by a machine (e.g., the electronic device 601). For example, a processor(e.g., the processor 620) of the machine (e.g., the electronic device 601) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to various embodiments of the disclosure may be included and provided in a computer program product. The computer program product may be traded as a product between a seller and a buyer. The computer program product may be distributed in the form of a machine-readable storage medium e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to the embodiments of the disclosure, poor contact of the slave printed circuit boards coupled to the interposers may be prevented.

Furthermore, according to the embodiments of the disclosure, EMI noise interference between the integrated circuit blocks may be efficiently blocked by the plurality of interposers.

In addition, the disclosure may provide various effects that are directly or indirectly recognized.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a processor;
a printed circuit board on which the processor is mounted;
a display device; and
a display power integrated circuit configured to supply electric power to the display device,
wherein the printed circuit board includes:
a first circuit board;
a first interposer formed on a first portion of the first circuit board;
a second interposer formed on a second portion of the first circuit board, the second portion being adjacent to the first portion;
a second circuit board coupled to the first interposer; and
a third circuit board coupled to the second interposer,
wherein the first interposer and the second interposer are disposed on a same surface of the first circuit board,
wherein the display power integrated circuit is mounted on a first surface of the third circuit board, the first surface being configured to face the first circuit board, and
wherein a connector connected to the display power integrated circuit is mounted on a second surface of the third circuit board, the second surface being opposite to the first surface of the third circuit board.

2. The electronic device of claim 1, wherein the printed circuit board has a shape in which the second portion protrudes from part of a side surface of the first portion.

3. The electronic device of claim 1, wherein the first circuit board is formed in an "L" shape,
wherein the second circuit board is disposed over the first portion of the first circuit board, and
wherein third circuit board is disposed over the second portion of the first circuit board and is spaced apart from the second circuit board.

4. The electronic device of claim 1, wherein the first portion, the first interposer, and the second circuit board form one shielding space.

5. The electronic device of claim 1, wherein the second portion, the second interposer, and the third circuit board form one shielding space.

6. The electronic device of claim 1, further comprising:
a power management integrated circuit,
wherein the power management integrated circuit is mounted on the first portion.

7. The electronic device of claim 1, further comprising:
a communication integrated circuit,
wherein the communication integrated circuit is mounted on one surface of the second circuit board.

8. The electronic device of claim 7, wherein the communication integrated circuit is mounted on a first surface of the second circuit board, the first surface being configured to face the first circuit board, and
wherein a connector connected to the communication integrated circuit is mounted on a second surface of the second circuit board, the second surface being opposite to the first surface.

9. The electronic device of claim 8, further comprising:
a sub-printed circuit board,
wherein the communication integrated circuit is connected to the sub-printed circuit board through a flexible printed circuit board (FPCB) connected to the connector.

10. The electronic device of claim 1, further comprising:
a camera power integrated circuit,
wherein the camera power integrated circuit is mounted on the second portion.

11. The electronic device of claim 1, further comprising:
a sub-printed circuit board,
wherein the display power integrated circuit is connected to the sub-printed circuit board through an FPCB connected to the connector.

12. The electronic device of claim 1, further comprising:
a battery,
wherein the battery is connected to the third circuit board through an FPCB.

13. The electronic device of claim 1, further comprising:
an antenna module,
wherein the antenna module is connected to the second circuit board through an FPCB.

14. The electronic device of claim 1, wherein the first circuit board has a larger area than at least one of the second circuit board and the third circuit board.

15. The electronic device of claim 1, wherein the first portion of the first circuit board overlaps the second circuit board and does not overlap the third circuit board, and
   wherein the second portion of the first circuit board overlaps the third circuit board and does not overlap the second circuit board.

16. The electronic device of claim 1, wherein the first interposer is formed in a first closed curve shape, and
   wherein the second interposer is formed in a second closed curve shape.

17. The electronic device of claim 16, wherein the second closed curve shape is different from the first closed curve shape.

18. The electronic device of claim 1, wherein the first circuit board is spaced apart from at least one of the second circuit board and the third circuit board in a first direction,
   wherein the second circuit board and the third circuit board are spaced apart from each other in a second direction different from the first direction, and
wherein the first interposer and the second interposer are spaced apart from each other in the second direction.

* * * * *